United States Patent [19]

Spano et al.

[11] 4,266,191
[45] May 5, 1981

[54] TEST PROBE ALIGNMENT APPARATUS

[76] Inventors: John D. Spano, 301 Green Moor Pl., Thousand Oaks, Calif. 91360; Danny R. Barnett, 3617 W. Abraham La., Glendale, Ariz. 85308

[21] Appl. No.: 31,192

[22] Filed: Apr. 18, 1979

[51] Int. Cl.³ .......................................... G01R 31/22
[52] U.S. Cl. ............................ 324/158 F; 324/73 PC
[58] Field of Search ............. 324/158 F, 158 P, 73 PC

[56] References Cited

U.S. PATENT DOCUMENTS

| 3,333,274 | 7/1967 | Forcier | 324/158 P |
| 3,849,728 | 11/1974 | Evans | 324/158 F |
| 3,949,295 | 4/1976 | Moorshead | 324/158 F |
| 3,996,517 | 12/1976 | Fergason et al. | 324/158 F X |
| 4,092,593 | 5/1978 | Wolk | 324/73 PC X |
| 4,103,232 | 7/1978 | Sugita et al. | 324/158 F |

OTHER PUBLICATIONS

Kehagioglou, Mirrored Alignment Gauge, IBM Technical Disclosure Bulletin, Oct. 1978, pp. 1962, 1963.
Rottmann, X-Y Alignment Tables with Angular Compensation, IBM Technical Disclosure Bulletin, Nov. 1967, pp. 798 & 799.
Beldring et al., Fiber Optic Sensor for Testing & Sorting Semiconductor Devices, Western Elec. Tech. Digest, No. 33, Jan. 1974, pp. 11 & 12.
Prilik et al., Semiconductor Wafer & Module Test Station Transport Mechanism, IBM Tech. Disl. Bull., Oct. 1975, pp. 1517 & 1518.
Groenick et al., Integrated Circuit Full Wafer Diagnostic Using Special Test Stage for Scanning Electron Microscope, IBM Technical Disclosure Bulletin, Jul. 1978, pp. 638 & 639.
Schuelke, Integrated Circuit Chip Positioning Tool, IBM Technical Disclosure Bulletin, Dec. 1970, pp. 2115, 2116.

Primary Examiner—Stanley T. Krawczewicz
Attorney, Agent, or Firm—H. Gordon Shields

[57] ABSTRACT

Test probe alignment apparatus for the alignment of test probes for testing integrated circuits includes three separate stages in which the theta stage is separate from the X-Y stage and the Z stage is separate from both the theta stage and the X-Y stage.

10 Claims, 7 Drawing Figures

TEST PROBE ALIGNMENT APPARATUS

BACKGROUND OF THE INVENTION

1. Field of the Invention

This invention relates to test equipment for electrically testing parts used in the assembly of hybrid integrated circuit apparatus, and, more specifically, this invention relates to the alignment of the probe testing apparatus relative to the devices to be tested by manipulating a separate theta stage, a separate X-Y stage, and a separate Z stage.

2. Description of the Prior Art

To align a probe station which includes electrical test leads to hybrid integrated circuit elements requires the movement of three stages, an X-Y stage, a theta or rotary stage, and a vertical stage. The elements to be tested are oriented by X-Y movement, and then they are rotated by a theta stage, which is a rotary displacement of the X-Y stage about a fixed point. After the X-Y and theta stages have been aligned, a test ring, which includes test leads or probes, is moved vertically downwardly in a Z stage movement to cause the electrical test probes to contact the desired portions of the integrated circuitry being tested.

Because the integrated circuitry being tested is so very small in relation to the ability of a human tester to both see and control his hand movements, the integrated circuitry to be tested is usually enlarged optically, as by a magnifying glass, and the alignment of the test probe apparatus is done by visual reference to the circuitry to be tested. The X-Y stage and the theta (rotary) stage are typically tied together, so that coordinated X-Y and theta movements are made. A single index location or mark is normally indexed first, by X-Y movement of a so-called "joystick", by which relatively "large" movements of the human tester on the joystick are reduced substantially by a simple pivoted lever. Since the two stages are tied together, an X-Y movement for alignment is followed by a theta or rotary movement, but the rotary movement causes some displacement of the X-Y stage. Accordingly, the X-Y stage is then aligned again, which results in rotary displacement, so that another theta stage movement is required. However, it may be understood that successive movements are substantially diminished so that ultimately the circuit elements are properly indexed for testing.

When the integrated circuit chip has been appropriately aligned under the two index markers, the electrical contact between the various portions or paths on the chip to be tested is accomplished by movement vertically downwardly of a fixed ring which includes a plurality of discrete test leads that are pre-positioned for each particular integrated circuit chip to be tested. Obviously, the probe test ring is appropriately indexed before the testing begins for each particular chip. When the chip is in position for test, the probe ring, with the electrical leads, is moved downwardly to make electrical contact. Through appropriate test equipment, the various components or circuits on the integrated circuit chip are then electrically tested. At the conclusion of the test, the probe ring is raised, the chip which has been tested is moved, and another chip is aligned for appropriate testing.

Depending on the skill of the human tester, a substantial amount of time is required for the alignment of each discrete chip to be tested. Since time is of the essence, any time which is saved in the alignment process is time gained in the overall testing sequence.

Movement of the Z stage downwardly for testing and upwardly after testing is generally not a problem with respect to time. However, movement of the X-Y stage and the theta stage is where the time consuming operation takes place, and it is at this portion of the testing that the substantial improvements may be affected. In the prior art, the X-Y stage and the theta stage are generally tied together so that double movement has to be made to keep the X-Y stage in proper alignment as the theta stage is moved. This results in the human tester being required to maintain a constant alignment by continuous movements altering the alignment procedure.

In the apparatus of the present invention, the problem of continuous alignment movements is obviated by separating or divorcing the theta stage from the X-Y stage. With the theta stage fixed in place for only rotary movement, movement is required only of the X-Y stage in order to align the primary alignment index mark to a location over the center of rotation of the theta stage. This is accomplished manually. Rotation of the theta stage then results in the alignment of the secondary index mark for complete alignment of a chip.

SUMMARY OF THE INVENTION

The invention described and claimed herein comprises an alignment test apparatus for testing integrated circuitry chips by manually moving an X-Y stage on a theta stage on which it is slidably disposed. The location of the chip to be tested is optically displayed and alignment of the chip is manually accomplished by reference to the optical display.

Among the objects of the present invention are the following:

To provide new and useful integrated circuit test apparatus;

To provide new and useful apparatus for electrically testing discrete electrical circuits;

To provide new and useful apparatus for aligning integrated circuit apparatus for testing;

To provide new and useful alignment apparatus having a theta stage separated from an X-Y stage;

To provide new and useful apparatus for manually aligning hybrid electrical circuit apparatus to a predetermined test probe; and To provide new and useful apparatus for moving integrated circuitry to a predetermined location relative to test equipment.

DESCRIPTION OF THE PREFERRED EMBODIMENT

Figure 1:
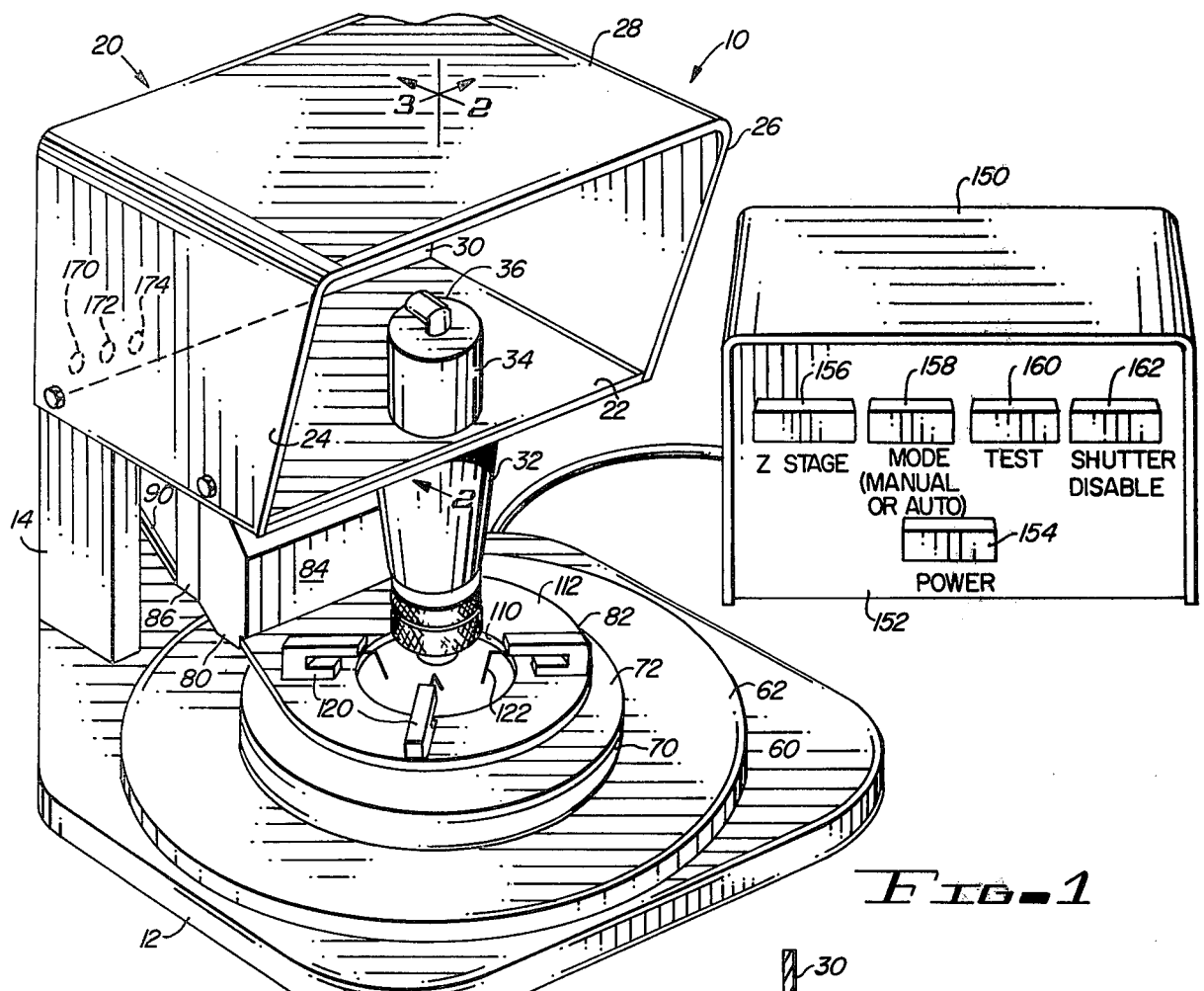
FIG. 1 comprises a perspective view of the apparatus of the present invention.
Figure 2:
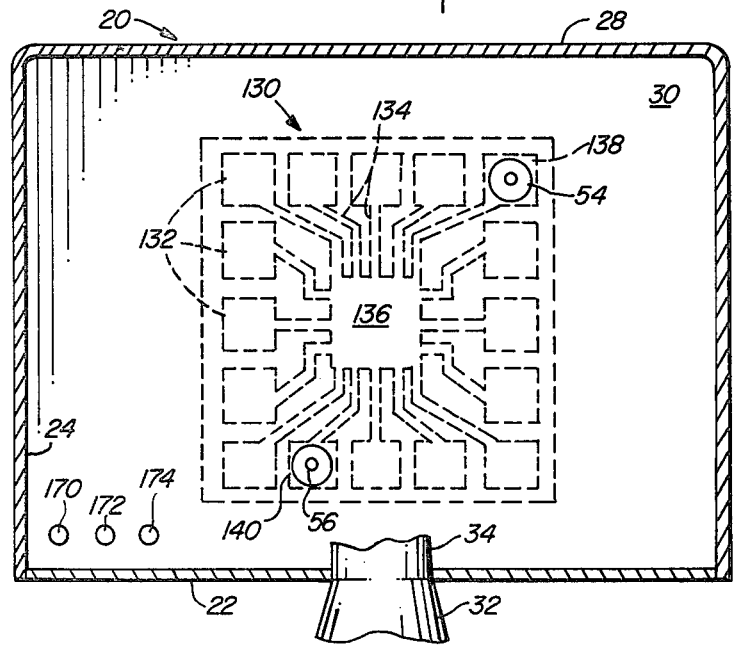
FIG. 2 is an enlarged view illustrating the alignment of circuitry in the apparatus of the present invention, taken generally along line 2—2 of FIG. 1.
Figure 3:
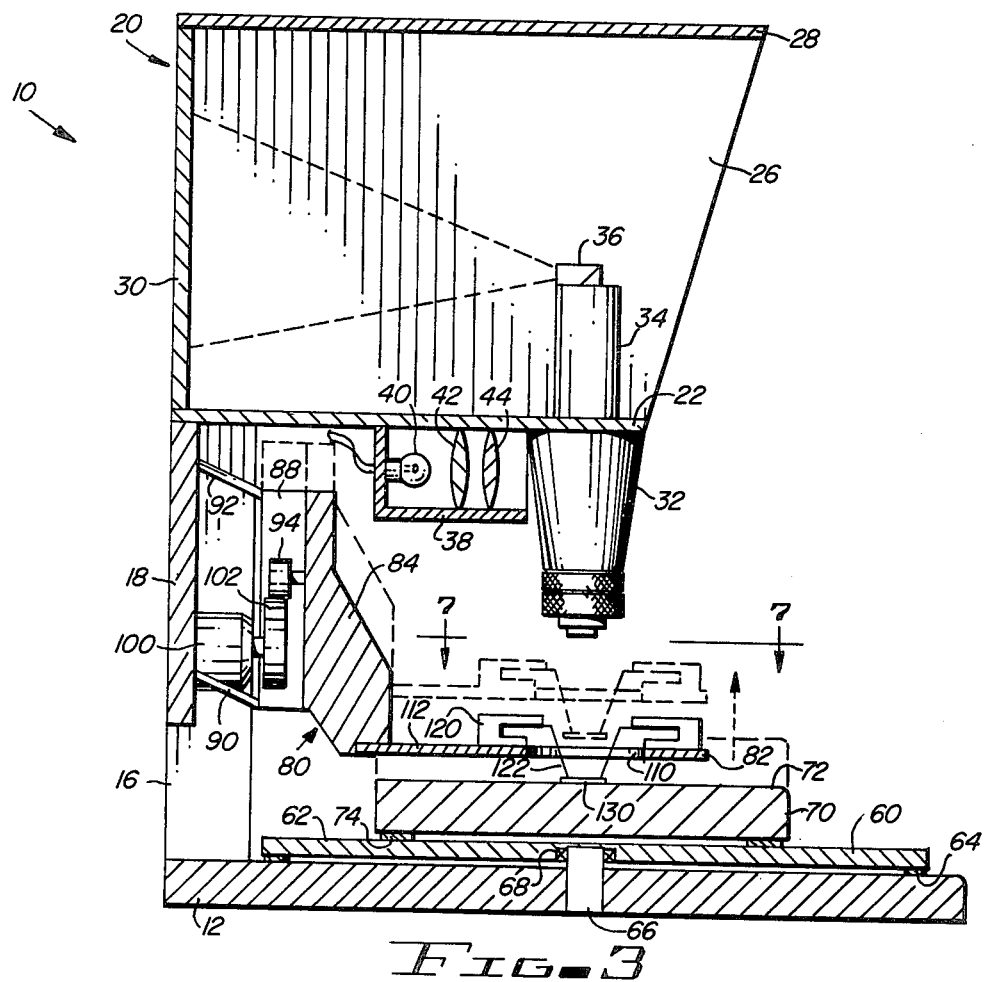
FIG. 3 is a view in partial section of the apparatus of FIG. 1 taken generally along line 3—3 of FIG. 1.

FIG. 1 is a perspective view of test apparatus 10 embodying the present invention. FIG. 2 also discusses part of the apparatus of the present invention, taken generally along line 2—2 of FIG. 1. FIG. 3 is a side view in partial section of the apparatus of FIG. 1 taken generally along line 3—3 of FIG. 1. For the following general discussion of the test apparatus 10 of the present invention, reference will be made to FIGS. 1, 2, and 3.

The prober or test alignment apparatus 10 includes a base 12 and a rear support 14, shown in FIG. 1, and a rear support 16, shown in FIG. 3. Also included is an optical hood, generally designated by reference numeral 20, which is secured to the rear supports 14 and 16. The hood includes a floor or bottom 22, a pair of sides 24 and 26, which extend upwardly from the floor and generally at right angles thereto, a top 28, which is substantially parallel to the floor 22, and a back or screen area 30. The optical hood apparatus 20, as best shown in FIGS. 2 and 3, is a generally rectangularly configured box with the floor and the top generally parallel to each other, and the sides and back are generally perpendicular to each other and also to the floor and the top. As indicated above, the hood 20 is secured to the base 12 through the vertically extending rear supports 14 and 16, which are both appropriately secured to the base 12. A back plate or panel 18, as best seen in FIG. 3, extends between, and is appropriately secured to, the rear supports 14 and 16. The supports 14 and 16 also provide support for the Z stage, which will be discussed in detail below.

Secured to the floor 22 of the hood 20 are components of the optical system employed with the present invention, including a lower housing 32, an upper housing 34, and a light source housing 38. Above the upper housing 34 is a light source housing 36 from which the optical display is projected against the rear wall or screen 30 of the hood 20. The lower lens housing 32 and the upper lens housing 34 are coaxially aligned with each other and they include the lens apparatus, beam splitter, and mirror apparatus shown schematically in FIG. 4 and discussed in conjunction therewith below.

A theta stage 60 is disposed on, and appropriately secured to, the base 12. The theta stage comprises a circular platform which is appropriately secured to, and journaled for rotation on the base 12. The center of rotation of the theta stage 60 is coaxially aligned with the optical housings 32 and 34. As best shown in FIG. 3, the theta stage 60 comprises a circular disc which includes a flat, planar top surface 62 on which is disposed an X-Y stage 70. The base 12 includes a plurality of pads 64, preferably three spaced apart pads, secured to the top surface of the base for contacting and supporting the theta stage disc 60. Three pads are preferably used to define a plane. The pads help provide stability for the theta stage 60.

The theta stage or disc 60 is secured to a shaft 66 which is secured to the base 12. The theta stage rotates in bearings 68 secured to the disc 60. The shaft 66 is directly secured to the base 12, and the theta stage 60 rotates thereon in the bearings 68.

The X-Y stage 70 comprises a circular disc which is freely movable on the top surface 62 of the theta stage.

The X-Y stage includes a top surface 72 and a plurality of pads 74, preferably three in number, secured to the bottom of the X-Y stage disc 70 for sliding movement over the top surface 62 of the theta stage 60. The three pads 74 define a plane which keeps the top surface 72 of the X-Y stage substantially parallel to the top surface 62 of the theta stage 60. Moreover, the three pads 74 also reduce the friction between the X-Y stage and the theta stage for sliding movement of the X-Y stage independently without movements of the theta stage. However, at the same time, the pads 74 do provide for a frictional engagement with the top surface 62 of the theta stage so that movement of the X-Y stage is in response to positive pressure from a user or operator of the probe test apparatus 10.

While movement of the X-Y stage is separate and independent from movement of the theta stage, it is obvious that movement of the theta stage will also result in movement of the X-Y stage. However, the separate movement of the X-Y stage by itself will not result in movement of the theta stage. For alignment purposes, as discussed below, the X-Y stage 70 is aligned first, and then the theta stage 60 is rotated to complete the alignment.

The third stage of the test apparatus 10 comprises a Z stage 80. The Z stage includes a probe ring 82 which is secured to a back support plate 84. In turn, the back support plate 84 is secured to a pair of side plates 86 and 88. A pair of lower arms 90 and a pair of upper arms 92 (see FIG. 3) are secured to the side plates, with one upper and one lower arm secured to each side plate. The opposite ends of the pairs of flexure arms 90 and 92 are in turn secured to the back plate 18 of the base 12. In this manner, the probe ring 82 is secured to the base 12, and the probe ring 82 moves vertically with respect to the theta and X-Y stages, and also relative to the base 12, on the arms 90 and 92.

Figure 6:
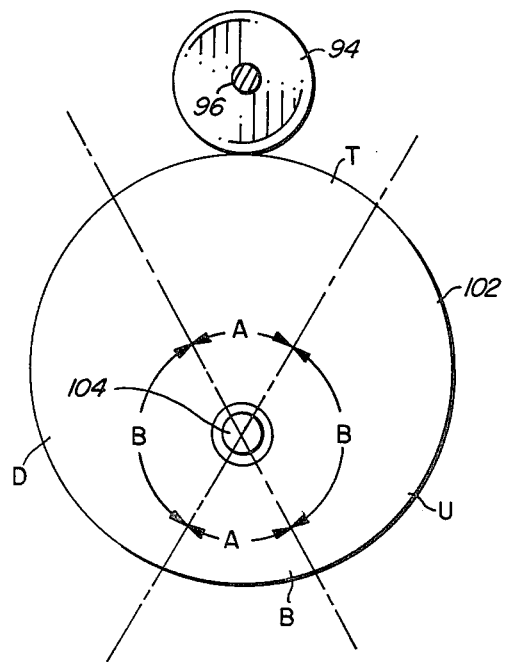
FIG. 6 is a schematic representation of the apparatus used to raise and lower the Z stage of the present invention.

Vertical movement of the Z stage 80 is accomplished by means of a motor 100, which is secured to the back plate 18, and a roller 94 which is secured to the back support plate 84 of the Z stage 80. The motor 100 includes a cam 102 which is secured for rotation on the output shaft of the motor 100. The cam 102 is in direct, rolling contact with the roller 94, as shown in FIGS. 3 and 6. FIG. 6 schematically illustrates the relationship between the cam 102 and the roller 94. The roller 94 is disposed on the top of the cam 102, and as the cam rotates in response to the rotary movement of the motor 100, the roller 94 acts as a cam follower, allowing the Z stage 80 to move vertically. The vertical movement moves the probe ring 82 close to the top surface 72 of the X-Y stage 70. The vertical upward movement moves the probe ring 82 away from the X-Y stage.

The cam 102, as schematically represented in FIG. 6, is an eccentric disc which includes areas of constant radius of somewhat over sixty degrees of dwell at both the top and bottom "surfaces" of the cam. This provides a substantially large area of angular dwell at the up and down positions of the roller 94 and the Z stage 80 attached thereto. Between the sixty degree portions of constant radius of the cam 102 are areas of one-hundred-twenty degrees of arc on both sides of the cam for vertical upward and downward movement of the Z stage. Since the total required vertical movement of the Z stage is relatively small, such as about one-eighth of an inch, it is obvious that the actual eccentricity of the cam 102 is very slight. Moreover, it is obvious also that with a constant radius of sixty degrees of dwell on opposite sides of the cam, the starting and stopping of the motor 100 is not critical with respect to the movement of the Z stage.

The Z stage 80 moves vertically in response to the rotary motion of the cam 102, imparted by the motor 100. The cam follower 94, secured to the back support plate 84 of the Z stage 80, freely rotates on the cam 102 on its shaft 96. The shaft 96 is in turn secured to the plate 84 of the Z stage 80. The vertical movement of the Z stage 80 comprises a somewhat pivoting type vertical motion through the two pairs of flexure arms 90 and 92. The lengths of the arms 90 and 92 are substantially identical, and therefore they maintain the Z stage 80 in a relatively stable orientation as the cam 102 operates. However, as will be understood, there is a forward and backward, or horizontal, component of the up and down vertical motion of the Z stage 80 as a result of the mechanical linkage. The vertical (up and down) motion of the Z stage 80 is shown in dotted line in FIG. 3, greatly exaggerated.

The probe ring 82 includes a center or centrally disposed aperture 110 which is located or oriented, as shown in FIG. 3, over the center of rotation of the theta stage 60. Extending outwardly or about the aperture 110 is a top horizontal surface 112 of the probe ring 82. Adjustably secured to the top surface 112 of the probe ring 82 are a plurality of probe manipulators 120. Each manipulator 120 includes a single probe needle 122 which is electrically connected to test equipment (not shown) by appropriate conductors (also not shown). The test needles or probes 122, and the manipulators 120, are secured to the probe ring 82 in such a position or location that each probe or needle 122 will make electrical contact with a particular pad or portion of an integrated circuit chip to be tested when the Z stage 80 is in its down position for testing. Such an integrated circuit chip 130 is shown in FIG. 3 disposed on the top surface 72 of the X-Y stage 70. The test needles or probes 122, secured to the probe test fixtures 120 are shown in FIG. 3 in electrical contact with the top surface of the integrated circuit chip 130, since the Z stage 80 is in its down position.

A view of the integrated circuit chip 130 is shown in FIG. 2 as projected on the rear screen 30 of the optical hood 20. The optical system, briefly discussed above, its schematically illustrated in FIG. 4, and a portion of the system is also shown in FIG. 3. For discussion of the optical system employed, reference will primarily be made to FIGS. 3 and 4.

Figure 4:
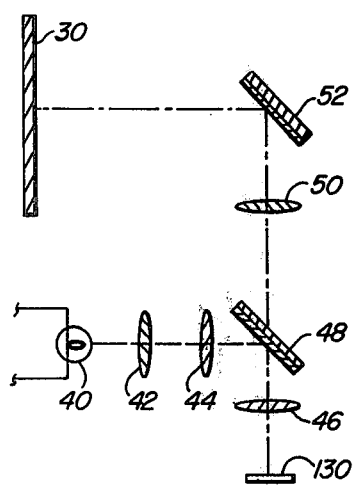
FIG. 4 is a schematic representation of the optical system of the present apparatus.
Figure 5:
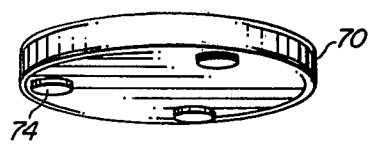
FIG. 5 is a perspective view of a portion of the apparatus of the present invention, comprising the freely movable X-Y stage.

The integrated circuit chip 130 is shown in FIG. 4 as being disposed beneath a lens 46. A light source 40 is shown disposed adjacent a pair of lens 42 and 44, both of which are substantially at right angles to the lens 46. Between the lens 46 and the pair of lenses 42 and 44 is a beam splitter 48. Light generated by the light source 40 is focused by the lenses 42 and 44 and reflected from the beam splitter 48 to the lens 46 and on to the integrated circuit chip 130. The image from the chip 130, as illuminated, is in turn directed through the lens 46 and through the beam splitter 48 upwardly. Between the beam splitter 48 and a mirror 52 is another lens 50. The image from the integrated circuit chip 130 passes through the lens 50 and is reflected from the mirror 52 and projected against the screen 30. The light source 40, with its lenses 42 and 44, is contained within the light source hosing 38, as shown in FIG. 3. The other components of the optical system are included in the lower lens housing 32 and the upper lens housing 34, the latter of which is surmounted by the projection housing 36, which encloses the mirror 52, to cause the image of the integrated circuit 130 to be reflected or projected onto the screen 30.

The image of the integrated circuit 130 is shown projected onto the screen 30 in FIG. 2. The integrated circuit 130, also shown in FIG. 7, is a typical semiconductor die or chip which includes a plurality of pads 132.

Figure 7:
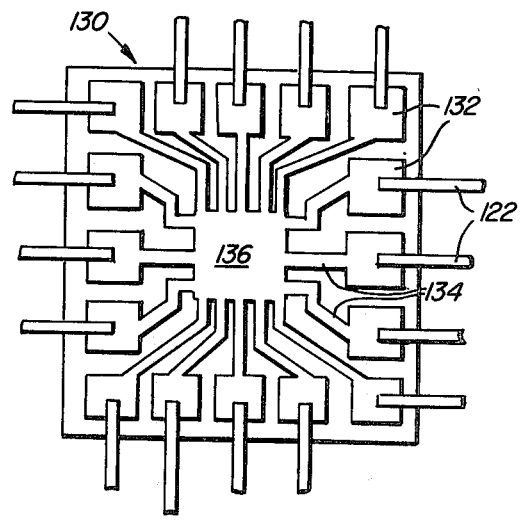
FIG. 7 is a top view, greatly enlarged, illustrating the test probe in place on an integrated circuit chip for testing purposes.

With respect to the die or chip 130, each pad is connected by a conductive path, such as identified by reference numeral 134 in FIGS. 2 and 7, to a particular portion or layer of semiconductor material in the center of the chip or die 130.

The center portion of the chip 130 is denoted by reference numeral 136. It comprises layers of semiconductor material which comprise the various elements making up the circuitry of the chip 130. Such semiconductor die or chip construction is well known and understood in the art. It will be noted that the pads 132 are disposed about the outer periphery of the chip 130, with the conductive paths 134 extending from the various pads to the center, layered portion 136 of the chip 130.

Two of the pads 132 are of importance with respect to the apparatus of the present invention. Those pads are designated by reference numerals 138 and 140 in FIG. 2, and they are spaced apart from each other. The pads 138 and 140 are selected to be the alignment pads for purposes of aligning the chip 130 for the test probe needles 122 which are in turn secured to the probe ring 82 and which are electrically connected to appropriate test apparatus. Each pad 132 is shown in FIG. 7 as being in electrical contact with a probe needle 122. Each needle is, as will be understood, electrically connected to test equipment which tests the particular circuit or circuitry within the layered portion 136 to which the pads 132 are connected by the conductive paths 134.

It will be noted that in FIG. 2 a pair of dots or beads 54 and 56 are superimposed on the pads 138 and 140, respectively. The dots 54 and 56 are part of the optical system, and are elements magnetically attached to the screen 30 and remain in fixed position relative to the optical system. The location of the dots 54 and 56 are predetermined for each different type of integrated circuit chip being tested. When a chip of a different size or different configuration is to be tested, the dots 54 and 56 are moved to coincide with a particular pair of spaced apart pads. One of the dots, either 54 or 56, is located at a position on the screen representing the center of rotation of the theta stage 60 for alignment purposes.

For illustrative purposes herein, the dot 54 will be considered to be aligned with the axis of rotation of the theta stage 60. Accordingly, for testing the semiconductor die or chip 130, the operator first places the pad 138 in alignment with the dot 54 by hand (manual) movement of the X-Y stage 70, and then rotates the theta stage 60, which causes the integrated circuit die 130 to pivot about the dot 54 and the pad 138. The theta stage 60 is rotated until the pad 140 is aligned with the dot 56.

At such time as the dots 54 and 56 are aligned with the pads 138 and 140, respectively, as shown in FIG. 2, the chip 130 is in position for testing. For test purposes, the operator of the test apparatus 10 must know which of the pads 132 is to be considered as the pivotal pad 138 and thus aligned with the central or pivotal dot 54, and which pad 132 is to be considered as the alignment pad 140, to be placed beneath the dot 56. With the understanding of the proper pad-dot alignment prior to starting the test procedures, a chip 130 is positioned on the X-Y stage 70, and the X-Y stage is manually positioned or moved on the theta stage 60 to align the key or pivotal pad and dot. The relative sliding movement of the X-Y stage 70 on the theta stage 60 is accomplished manually by an operator by visual reference to the dots placed on the screen and magnetically secured thereto, and to the image projected on the screen 30 of the die. After the pad 138 is aligned with the dot 54, the theta stage 60 is manually rotated until the pad 140 is aligned with the dot 56.

When the chip or die 130 is aligned with the dots 54 and 56, it is also aligned with the probe needles 122 on the probe ring 82 of the Z stage 80. The Z stage is moved downwardly by manual actuation which causes the needles 122 to contact the pads 132. The testing is then accomplished and the Z stage moves upwardly, either by manual actuation or automatically, and the apparatus is then ready for alignment with and testing of another chip.

The new chip is brought into alignment beneath the lower optical housing 32 within the central aperture 110. The test operator applies appropriate directional pressure to the oter periphery of the X-Y stage 70 to cause the X-Y stage to move into the desired location. While the integrated circuit chips 130 are very, very small, it has been determined that the human hands are capable of discrete movements of about 0.0005 inches. Thus, an experienced operator can move a particular pad into proper alignment, regardless of how small the chips, and their pads, are. It will be understood and appreciated that if a "waffle pack" is being tested, each individual die or chip in the pack is sequentially tested before moving the X-Y stage out from beneath the probe ring to replace the tested pack for an untested pack.

With the dots 54 and 56 positioned on the screen 30, in fixed positions, the pad 138 is first aligned with the dot 54 by direct movement only of the X-Y stage 70. With the dot 54 superimposed on the pad 138, the operator then rotates the theta stage 60 to bring the pad 140 beneath the dot 56. When the pds 138 and 140 are both aligned with the dots 54 and 56, respectively, the chip 130 is in position for testing. The operator then releases the theta stage 60.

The electrical system for the probe test apparatus 10 includes a control box 150, shown in FIG. 1. A plurality of switches 154, 156, 158, 160, and 162, are shown extending forwardly from a front panel 152 of the control box 150.

The switches 154 . . . 162 are well known and understood slide switches which are pushed directly inwardly (horizontally) for actuation and for deactivation. Obviously, any of several types of switches may be used in place of the slide switches shown.

Switch 154 is the master switch for the apparatus 10. It controls electrical power to the entire apparatus, including the optical system, the electrical Z stage motor.

Switch 156 is associated with the motor 100, and actuation of the switch causes the Z stage 80 to move upwardly an downwardly. When the switch 156 is actuated initially, the Z stage 80 moves downwardly. After completion of the test, actuation of the switch 156 a second time causes the Z stage to move upwardly.

Switch 158 is the mode selection switch and is used to select either a manual mode for the apparatus 10 or an automatic mode for the apparatus. In the manual mode, the switch 156 must be actuated separately for movement downwardly and upwardly of the Z stage, and the test switch 160 must also be actuated after the Z stage has moved downwardly to initiate the electrical testing. In the automatic mode, the Z stage moves downwardly, the testing procedure then follows, and switch 156 is pushed and the Z stage is caused to move up by automatic signal from the test system, after the testing procedure has been accomplished.

Switch 160, the testing switch, is actuated in the manual mode after the Z stage 80 moves downwardly and the probe needles 122 contact the pads on the particular chip or die being tested. The contact between the needles 122 and the pads 132 is shown in FIG. 7. Upon actuation of the switch 160, the die or chip is connected, through the leads or probe needles 122, to appropriate electrical circuitry for testing of the semiconductor chip components.

Switch 162 is the shutter disable switch. When the switch 162 is actuated, a shutter within the optical system is actuated to prevent light from the light source 40 from impinging on the semiconductor chip 130. The light impinging on the semiconductor chip 130 causes the generation of an electromotive force (EMF) in the semiconductor material which in turn results in erroneous test data. In the automatic mode, which was discussed above, the shutter automatically is actuated prior to the initiation of the test procedure.

A foot switch or knee switch for moving the Z stage 80 upwardly and downwardly may be placed in parallel with the Z stage switch 156. Accordingly, the Z stage may be moved upwardly and downwardly by other than a hand switch, if desired. Such optional switches are well known in the art, and are not illustrated herein.

Integrated circuits are typically supplied in "waffle" or chip trays, which generally hold from about thirty-six to about 100 chips per tray or pack, depending upon the size of the particular chips. Chips vary in size from about one-tenth of an inch to about one-fourth of an inch square. The conductive pads, such as the pads 132 of the chip 130 (see FIGS. 2 and 7), are generally about six-thousandths of an inch square. In working with such dimensions, it is obvious that an optical system be provided that is relatively free from distortion so as to allow an operator to manually align designated pads, such as the pads 138 and 140, with the appropriate dots, such as dots 54 and 56. Assuming that dot 54 is the dot aligned with the center of rotation of the theta stage, the pad 138 is first aligned with the dot 54. This is accomplished by the operator manually moving the X-Y stage into position with reference to the optical projection of the chip 130 on the screen 30. While a projecting microscope type viewing system is illustrated herein, it is obvious that a TV camera and screen could also be used, with the TV camera fixed in place over the center of rotation of the theta stage.

For practical purposes, the X-Y stage 70, which moves freely and independently on the theta stage 60, may be colored differently from the theta stage so as to provide contrast with the theta stage. It will be noted that both the X-Y stage 70 and the theta stage 60 include three pads for providing stability to the respective stages. The three pads also define a plane for each stage, as discussed above. As also discussed above, there is appropriate friction between the theta stage and the X-Y stage so that a certain amount of effort is required to move the X-Y stage on the theta stage. This prevents the X-Y stage from being inadvertently moved out of position when it is initially aligned, and gives the operator a positive feel for movement of the X-Y stage. Once the X-Y stage is positioned with respect to the theta stage so that the center of rotation dot 54 is aligned with the pad 138, the operator then causes the theta stage to rotate in the appropriate direction so as to align the index dot 56 with the pad 140. When this has been accomplished, the chip 130 is in position for testing.

If the operator desires to have the test sequence accomplished automatically from this point, the switch 158 is actuated to provide automatic testing. The Z stage 80 is moved down by manual control, but the testing sequence follows automatically, and the Z stage moves upwardly automatically after testing. For testing purposes, the probe needles 122 are connected to various test equipment or circuits, such as a continuity tester, a plurality of circuits to functionally test the circuits on the chip 130, and perhaps to an oscilloscope, and/or other appropriate test equipment.

In FIGS. 1 and 2, particularly FIG. 2, there is shown in the lower left hand corner of the screen 30 three small lights identified by reference numerals 170, 172, and 174. Rather than being lamps, the lights may be light emitting diodes, or any other appropriate source of illumination, as desired. One lamp, for example, lamp 170, may be red, one lamp, such as lamp 172 may be green, and the third lamp, such as lamp 174, may be amber. The lamps 170 and 172 are connected to the testing apparatus, while the lamp 174 is connected to the Z stage motor 100. While the Z stage 80 is moving downwardly, lamp or LED 174 will glow amber indicating that the Z stage 80 is moving and that the X-Y stage 70 and the theta stage 60 should not be moved or adjusted. If the chip successfully passes the test, lamp 172, the green lamp, will illuminate. The green illumination indicates that the chip has successfully passed the testing procedure. However, if the chip fails to pass the test, the red lamp 170 is illuminated to indicate failure of the test. A different disposition is obviously made of the chips which pass the testing, as opposed to the chips which fail to pass the testing.

FIG. 7, taken generally along line 7—7 of FIG. 3, shows an enlarged view of a chip 130 with a plurality of test probes 122 touching the pads 132 of chip 130. The chip 130 is substantially the same chip 130 as shown in FIG. 2. The chip 130 includes sixteen discrete pads 132 disposed about the periphery of the chip 130, with the integrated circuit 136, located on the interior of the chip, connected to the pads by etched conductive runs 134. This has been discussed in detail above. While FIG. 1 shows only three probes 120 secured to the probe ring 82, it is obvious that there must be a probe, with a probe needle, for each pad on the chip being tested. FIG. 7 thus shows sixteen test needles 122, one test needle in electrical contact with each pad 132. As in understood, when the chips, such as a chip 130, are packaged, a conductor, usually a fine piece of gold wire, is welded to each pad, with the gold wire conductor extending to a much larger lead or pin on a lead frame which extends externally of the package and which is ultimately connected to appropriate conductors, connectors, or the like for use applications.

FIG. 6 shows an enlarged schematic view of the cam 102, secured to and rotating about the output shaft 104 of the motor 100. In rolling contact with the outer periphery or cam surface of the cam 102 is the roller or follower 94 which moves the Z stage 90 vertically as the cam 102 rotates. The roller or follower 94 is secured for rotaty movement about a shaft 96, which is in turn secured to the back support plate 84 of the Z stage 80 (see FIG. 3).

As indicated by the geometric divisions of the cam 102, which extend through the center rotation of the shaft 104, the cam 102 is divided generally into four portions, a pair of angular portions A and a pair of angular portions B. The angular portions A are each sixty degrees wide, while the angular portions B are one-hundred-twenty degrees wide. For convenience of illustration, the angular portions A are designated by letters T and B, and the angular portions are indicated by letters U and D. It will be noted that the shaft 104 is eccentrically located with respect to the cam 102, and accordingly the radius between the center of rotation of the cam 102 in the outer periphery of the cam 102 changes as the cam rotates. For convenience, the letter T designates the top portion of the cam, and the radial distance between the shaft 104 and T is greater than the radial distance between the shaft 104 and the outer periphery of the B portion, although the angular distance of both T and B portions is the same. It will be noted that the areas T and B have constant radii throughout their respective portions. That is, the radial distance of the entire portion B of the cam 102 is the same, and similarly, the radial distance of the cam portion T is the same over its entire, sixty degrees of arcuate length or distance. However, the radius of the adjacent portions, the cam portions designated by the letters U and D is changing. The radius of the cam 102 from the B portion of the cam to the T portion of the cam increases from a minimum radius to a maximum radius for both the U and the D portions. However, with respect to rotation of the cam 102, assuming a clockwise rotation of the shaft 104 and the cam 102, the radial distance of the A portion of the cam decreases from the maximum constant radius of the T portion to the minimum constant radius of the B portion, and then increases in the U portion of the cam.

The radial distance between the shaft 104 and the outer periphery of the area T is of course greater than the radial distance between the shaft 104 and the outer periphery of the cam area B. Accordingly, as the T area is driven beneath the roller 94 of shaft 96, the Z stage 80 is in its top or upper position.

Assuming clockwise rotation of the shaft 104, the D area of the cam 102, as it moves underneath the roller 94, allows the roller 94 to move downwardly, moving the Z stage downwardly. The B area of the cam 102 is, of course, the bottom area, with the cam follower 94 at its lowermost position as it rotates on the outer periphery of the B portion of the cam.

When the motor 100 is stopped with the roller 94 on the B area of the cam, the Z stage is in its lowest position, ready for testing. After testing has been completed, continued clockwise rotation of the shaft 104, and the cam 102 secured thereto, causes the U portion of the cam 102 to rotate beneath the follower 94 which in turn causes the Z stage to move upwardly until the T portion of the cam is once again beneath the roller 94. At such time as the roller 94 is again in contant with the T portion of the cam, as shown in FIG. 6, the X-Y stage 70 may be moved beneath the probe ring 82 for changing the chip to be tested.

As is understood, with the cam and motor drive system described herein, the motor 100 need only rotate in one direction, and its starting and stopping, both over a sixty degree arcuate distance of substantially constant radius, is not critical.

The apparatus described above may be used to align and test a variety of elements with a minimum of effort on the part of an operator. Visual contact is maintained during the alignment procedure, and is interrupted only during the test procedure.

The changing from the testing of one type of element to another requires only the changing of a single fixed indexing point, since one fixed indexing point will always remain on the center rotation of the theta stage. In the example given above, the fixed alignment point or dot 54 is located or disposed on the center of rotation of the theta stage 60. The other fixed alignment point, dot 56, must be moved to a new fixed location when an element or chip of a different design is to be tested after alignment.

Obviously, the location of the predetermined alignment points or pads on an element or chip to be tested must be appropriately selected for each particular design. Moreover, the test probes must also be located so as to contact the appropriate pads or portions of an element or chip during the testing procedure.

What is claimed is:

1. Apparatus for aligning an element having two predetermined indexing points with two fixed alignment points on the apparatus, comprising, in combination:
   base means;
   a first stage secured to the base means and rotatable thereon, with the first point of the two fixed alignment points disposed on the center of rotation of the first stage;
   a second stage disposed on the first stage for supporting the element to be aligned and freely movable on the first stage and adapted for manual alignment of one of the predetermined indexing points of the element with the first fixed alignment point, and movable with the first stage for rotating the first stage and the second stage to align the other of the predetermined indexing points of the element with the second fixed alignment point after the alignment of the one predetermined indexing point of the element with the first fixed alignment point.

2. The apparatus of claim 1 in which the base means includes optical means for viewing the two fixed alignment points and the element while moving the second stage on the first stage and while rotating the first stage and the second stage.

3. The apparatus of claim 2 in which the base means further includes a third stage movable vertically relative to the first and second stages.

4. Probe test alignment apparatus for aligning an element having a first predetermined alignment point and a second predetermined alignment point for testing the element, comprising, in combination:
   base means, including a first alignment point and a second alignment point for alignment with the first and second predetermined alignment points of the element;
   a first stage rotatably secured to the base means having a center of rotation coinciding with the first alignment point;
   a second stage for supporting the element to be aligned and tested disposed on the first stage and manually movable thereon for directly aligning the first predetermined alignment point of the element with the first alignment point of the base means, and movable with the first stage for rotating the first stage and the second stage disposed thereon to align the second predetermined alignment point of the element with the second alignment point of the base means.

5. The apparatus of claim 4 in which the base means includes optical means for providing visual contact with the first and second alignment points of the base means and the element.

6. The apparatus of claim 5 in which the first and second alignment points of the base means are selectively movable on the base means for use with a plurality of elements having different predetermined alignment points.

7. The apparatus of claim 6 in which the first and second alignment points are magnetically secured to the base means.

8. The apparatus of FIG. 4 in which the base means includes a third stage movable relative to the first and second stages, and test equipment for testing the element secured to the third stage.

9. The apparatus of claim 8 in which the base means further includes optical means for projecting an image of the element to be tested for providing visual contact therewith.

10. The apparatus of claim 9 in which the base means further includes a screen and the first and second alignment points are magnetically secured to the screen and the image of the element is projected onto the screen.

* * * * *